(12) United States Patent
Huang et al.

(10) Patent No.: US 6,291,295 B1
(45) Date of Patent: *Sep. 18, 2001

(54) METHOD OF FORMING A STORAGE ELECTRODE OF A CAPACITOR ON AN ION-IMPLANTED ISOLATION LAYER

(75) Inventors: Kuo-Tai Huang, Hsinchu; Tri-Rung Yew, Hsinchu Hsien; Water Lur, Taipei, all of (TW)

(73) Assignee: United Microelectronics Corp., Hsinchu (TW)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/316,979

(22) Filed: May 24, 1999

(51) Int. Cl.[7] ................................. H01L 21/8242
(52) U.S. Cl. ...................... 438/255; 438/398; 438/783
(58) Field of Search ................... 438/254, 255, 438/398, 397, 386, 253, 239, 396, 782, 783; 257/300, 303, 306, 296, 309

(56) References Cited

U.S. PATENT DOCUMENTS

| 5,656,860 | * | 8/1997 | Lee ........................................ 257/751 |
| 5,721,153 | * | 2/1998 | Kim et al. ............................. 438/398 |
| 5,723,373 | * | 3/1998 | Chang et al. ......................... 438/253 |
| 5,923,989 | * | 7/1999 | Lin et al. .............................. 438/398 |

* cited by examiner

*Primary Examiner*—Olik Chaudhuri
*Assistant Examiner*—Hoai Pham

(57) ABSTRACT

A method of fabricating a capacitor. An isolation layer is formed on a substrate. An ion implantation step is performed. The isolation layer is patterned to form an opening in the isolation layer. The opening exposes a portion of the substrate. A patterned conductive layer is formed on the isolation layer to fill the opening. A hemispherical grained silicon layer is performed on the conductive layer. In addition, the step order of the ion implantation step can be changed. The ion implantation can also be performed after the opening is formed.

16 Claims, 3 Drawing Sheets

METHOD OF FORMING A STORAGE ELECTRODE OF A CAPACITOR ON AN ION-IMPLANTED ISOLATION LAYER

BACKGROUND OF THE INVENTION

1. Field of the Invention

The present invention relates to a semiconductor fabrication method. More particularly, the present invention relates to a method of fabricating a storage node of a capacitor.

2. Description of the Related Art

As the integration of semiconductor devices increases, sizes of semiconductor devices must be decreases in accord with a design rule. However, as the size of a DRAM (dynamic random access memory) decreases, the capacitance of a DRAM capacitor is correspondingly reduced. Therefore, it is necessary to refresh the capacitor frequently. In order to decrease the refreshing frequency, the capacitance of the capacitor must be increased. Methods for increasing the storage capacitance of the capacitor include (1) increasing the surface area of a capacitor; (2) selecting a dielectric material with a high dielectric constant; and (3) reducing the thickness of a dielectric layer. Because of the limitation in dielectric materials and fabrication techniques, only limited reduction can be made in the thickness of the dielectric layer.

An electrode with a hemispherical grained silicon (HSG-Si) layer with increased surface area is commonly used in a storage electrode for increasing the capacitance of a capacitor. Since the HSG-Si layer is formed at a high temperature, an out-gassing problem easily occurs in an inter-poly dielectric (IPD) layer. The gas generated from the IPD layer easily is easily adsorbed to the surface of the storage electrode and retards the silicon migration of the storage electrode. Thus, the formation of the HSG-Si layer the storage electrode is suppressed. The conventional method solves the out-gassing problem by forming a silicon nitride layer on the IPD layer. However, this causes a poor etching selectivity during the formation of the hemispherical grains. That is, silicon atoms also migrate on a surface of the silicon nitride layer to affect the insulation performance of the IPD layer.

SUMMARY OF THE INVENTION

The invention provides a method of fabricating a storage electrode. An isolation layer is formed on a substrate. An ion implantation step is performed. The to isolation layer is patterned to form an opening. The opening exposes a portion of the substrate. A patterned conductive layer is formed on the isolation layer to fill the opening. A hemispherical grained silicon layer is formed on the conductive layer. In the invention, the sequence of the ion implantation step can be changed as specifically required. The ion implantation can also be performed after the opening is formed.

The material of the isolation layer comprises borophosphosilicate glass (BPSG), phosphosilicate glass (PSG), plasma-enhanced tetra-ethyl-ortho-silicate (PE TEOS), and TEOS-based oxide. The isolation layer may further comprise a sandwich structure comprising a silicon nitride layer or a silicon-oxy-nitride layer as an inner layer. The silicon nitride layer or a silicon-oxy-nitride layer is formed to suppress out-gassing.

The ion implantation is performed to prevent C—H bonds and C—O bonds in the isolation layer from breaking during a subsequent thermal step. The ion implantation step is used for preventing the isolation layer from generating gas. Thus, the present invention increases the formation of the HSG-Si layer.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
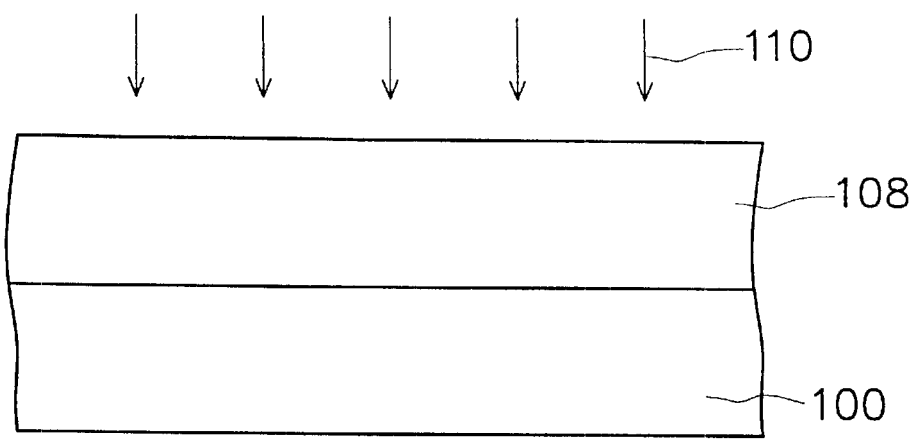
FIGS. 1A through 1D are schematic, cross-sectional views showing a method of fabricating a storage node of a DRAM capacitor according to the first preferred embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

In FIG. 1A, a variety of devices (not shown), such as a metal oxide semiconductor (MOS) transistor, a word line, or a bit line, are formed on a substrate 100. The substrate 100 comprises a semiconductor substrate. An isolation layer 108, such as inter-poly dielectric (IPD), is formed on the substrate 100. The material of the isolation layer 108 comprises borophosphosilicate glass (BPSG), phosphosilicate glass (PSG), plasma-enhanced tetra-ethyl-ortho-silicate (PE TEOS), TEOS-based oxide, etc. The isolation layer 108 is preferably formed at a temperature of about 450° C. to about 600° C. The bond breaking of the C—H bonds and the C—O bonds generates gas and leads to an out-gassing problem. Thus, in the present invention, an ion implantation step is performed with a dopant 110. The ion implantation is performed to terminate broken bonds of C—H bonds and C—O bonds in the isolation layer 108 during a subsequent thermal step, in order to prevent gas generation. The dopant 110 comprises nitrogen ions.

Figure 1B:
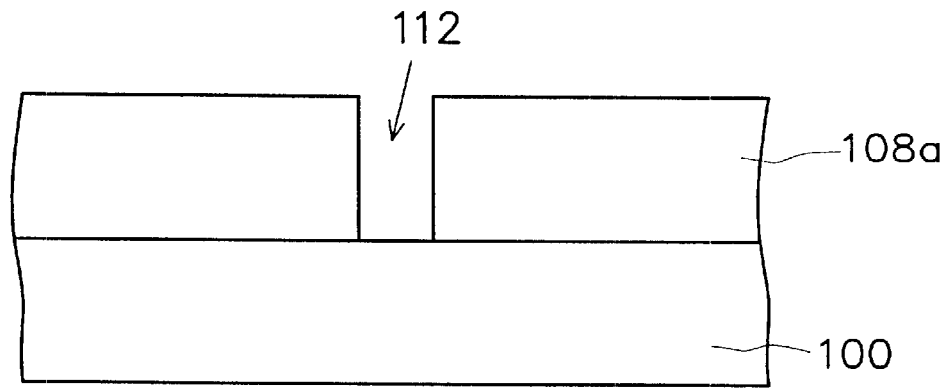

In FIG. 1B, the isolation layer 108 (shown in FIG. 1A) is patterned to form an isolation layer 108a. An opening 112 is formed in the isolation layer 108a. The 112 exposes a portion of the substrate 100. The exposed substrate 100 can be, for example, a source/drain region of a MOS transistor (not shown).

Figure 1C:
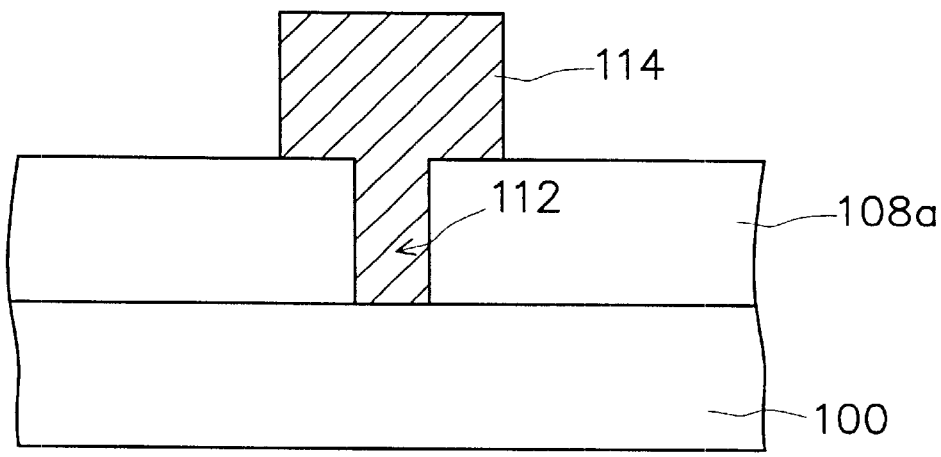

In FIG. 1C, a conductive material (not shown) is formed on the isolation layer 108a to fill the opening 112. The conductive material comprises polysilicon and amorphous silicon. The conductive material is patterned to form a conductive layer 114.

Figure 1D:
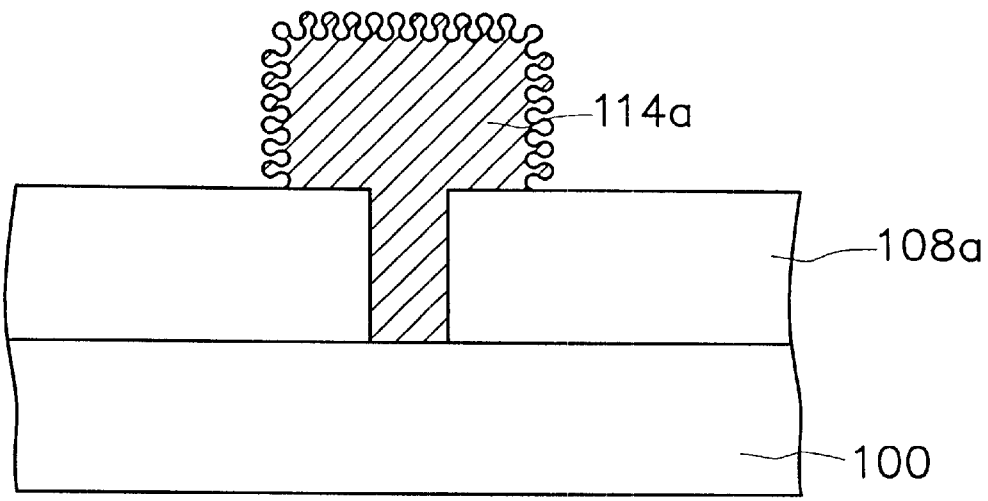

In FIG. 1D, a step for forming a selective HSG-Si layer is performed. The step for forming a selective HSG-Si layer comprises a seeding step and an annealing step. The silicon atoms of the conductive layer 114 surface migrate to form a mushroom-shaped HSG-Si layer. The conductive layer 114 is converted into a storage electrode 114a as shown in FIG. 1D while no HSG-Si structure is formed on the isolation layer 108.

In the invention, the isolation layer 108a is implanted by the ion implantation step (shown in FIG. 1A). The ion implantation step prevents gas generation from the isolation layer 108a during the annealing step. The atom migration of the conductive layer 114 surface is not affected. Thus, a high quality storage node 114a can be formed.

Figure 2A:
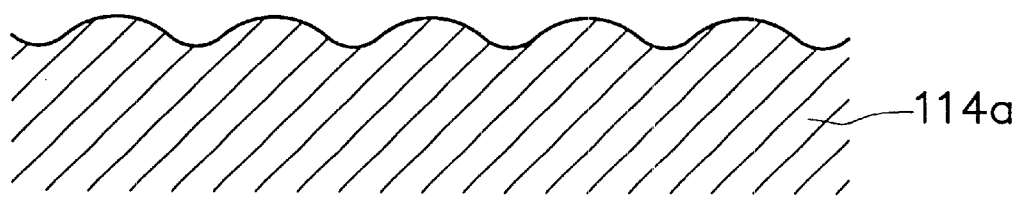
FIG. 2A is an enlarged, schematic, cross-sectional view of a portion of a storage electrode formed by a conventional method.
Figure 2B:
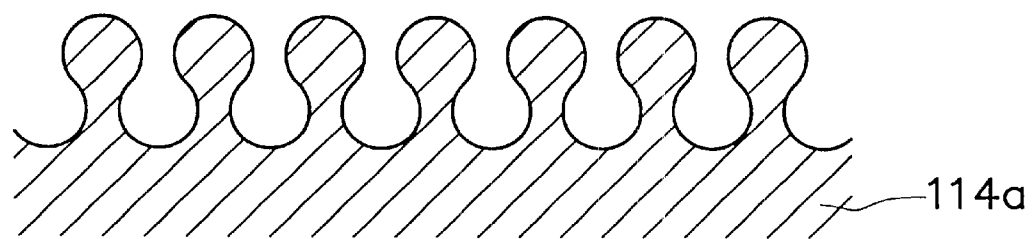
FIG. 2B is an enlarged, schematic, cross-sectional view of a portion of a storage electrode formed by the present invention.

In the conventional method, the isolation layer 108a is not implanted by ion implantation and the C—H bonds and the C—O bonds break, which leads to an out-gassing problem. The released gas is easily adsorbed to the surface of the conductive layer 114 and affects the migration of the silicon atoms. Thus, the surface area of the storage electrode cannot be effectively increased, as shown in FIG. 2A. In the invention, the isolation layer 108a is implanted by ion implantation. Thus, the above-described problems do not occur. A mushroom-shaped HSG-Si layer is formed, as shown in FIG. 2B. The surface area of the storage node is significantly increased.

Figure 3:
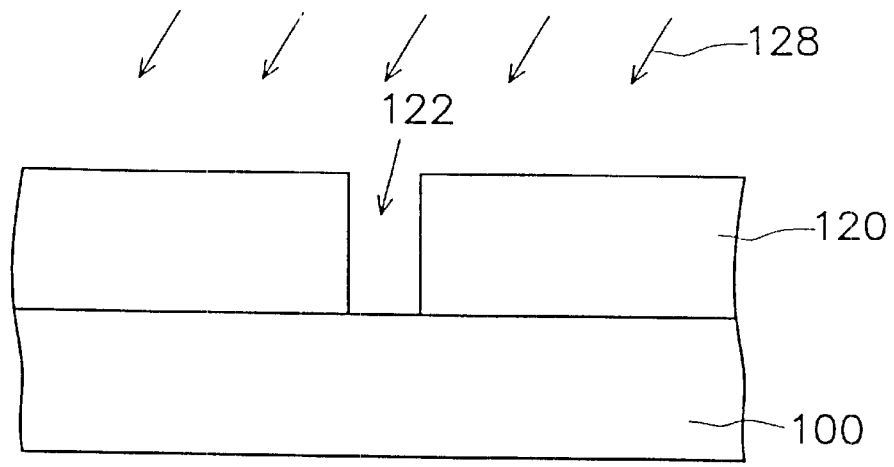
FIG. 3 is a schematic, cross-sectional view showing an ion implantation step performed on an isolation layer according to the second preferred embodiment of the invention.

Reference is made to FIG. 3, which explains the second preferred embodiment of the invention. In the second preferred embodiment, the order of steps for the ion implantation is changed. The ion implantation step, which is used to resolve the out-gassing problem, is performed after forming an opening in an isolation layer.

In FIG. 3, an isolation layer 120 is formed on a substrate 100. The isolation layer 120 comprises an opening 122. The opening 122 exposes a portion of the substrate 100. An ion implantation step is performed in order to prevent out-gassing. In the ion implantation step, a dopant 128 is implanted with a tilt angle. The dopant 128 comprises nitrogen ions. The tilt angle of the dopant 128 is preferably about 5° to about 20°.

Some follow-up steps of forming the storage electrode are performed. The follow-up steps are the same as the first embodiment. So, these follow-up steps are not here described again.

Figure 4:
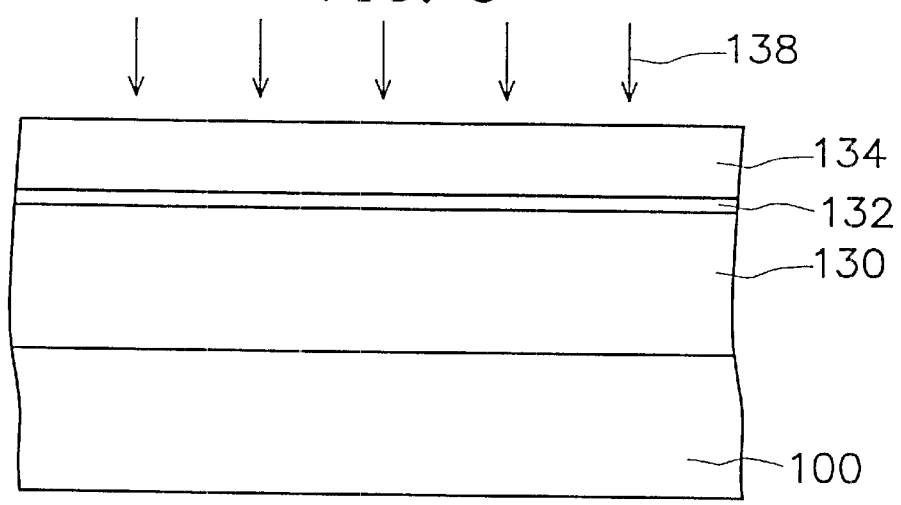
FIG. 4 is a schematic, cross-sectional view showing an ion implantation step performed on an isolation layer according to the third preferred embodiment of the invention.

Reference is made to FIG. 4, which explains the third preferred embodiment of the invention. The fabrication process of the third preferred embodiment is almost the same as that of the first preferred embodiment. In FIG. 4, a first planarized isolation layer 130 is formed on a substrate 100. A second planarized isolation layer 132 is formed on the first isolation layer 130. The first isolation layer 130 is thicker than the second isolation layer 132. A third isolation layer 134 is formed on the second isolation layer 132. The first isolation layer 130, the second isolation layer 132, and the third isolation layer 134 together form an IPD layer of a sandwich structure. The material of the first isolation layer 130 and the third isolation layer 134 comprises BPSG, PSG, PE TEOS, and TEOS-based oxide. The first isolation layer 130 and the third isolation layer 134 are preferably formed at a temperature of about 450° C. to about 600° C. The material of the second isolation layer 132 comprises silicon nitride and silicon oxide. The second isolation layer 132 can be used to prevent the gas generated from the first isolation layer 130 from being released.

An ion implantation step is performed with a dopant 138. The dopant 138 is preferably nitrogen ions. Some follow-up steps are performed for forming the storage electrode. The follow-up steps are the same as the first embodiment. So, these follow-up steps are not here described again.

In addition, the main material of the third isolation layer 134 of the IPD layer is silicon oxide. Thus, during the step of forming the selective HSG-Si layer, the isolation layer 134 provides a good selectivity.

Figure 5:
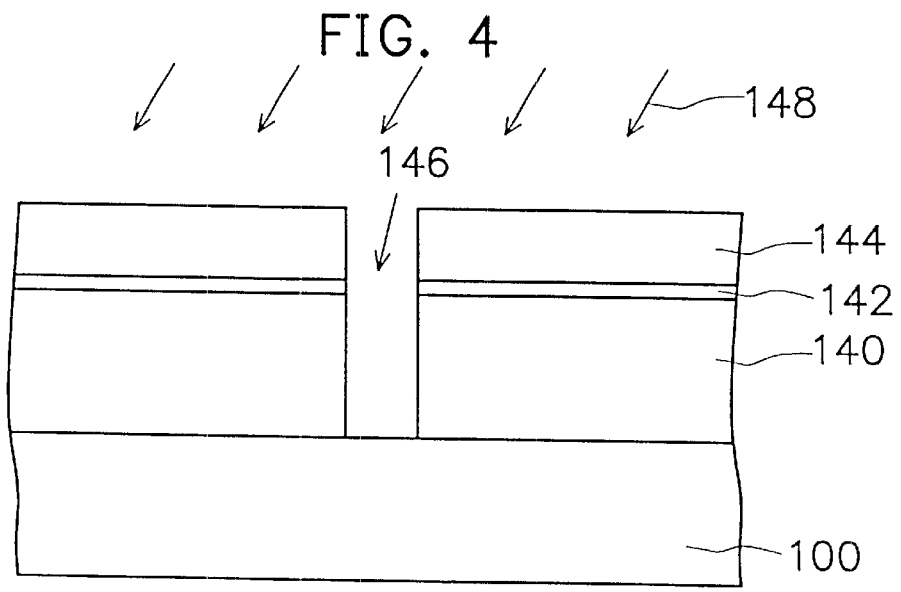
FIG. 5 is a schematic, cross-sectional view showing an ion implantation step performed on an isolation layer according to the fourth preferred embodiment of the invention.

Reference is made to FIG. 5, which explains the third preferred embodiment of the invention. The fabrication process of the fourth preferred embodiment is almost the same as the first embodiment.

In FIG. 5, a first isolation layer 140, a second isolation layer 142, and a third isolation layer 144 are formed in sequence over a substrate 100. An opening 146 is formed in the first isolation layer 140, the second isolation layer 142, and the third isolation layer 144. An ion implantation step is performed with a dopant 148. The ion implantation step prevents the out-gassing problem from occurring. The dopant 148 of the ion implantation step is implanted with a tilt angle. The tilt angle of the dopant 148 is preferably about 5° to 20°. The dopant 148 comprises nitrogen ions.

Some follow-up steps are performed to form a storage electrode. The follow-up steps are the same as the first embodiment. So, these follow-up steps are not here described again.

IN SUMMARY, THE INVENTION INCLUDES AT LEAST THE FOLLOWING ADVANTAGES

1. The present invention uses ion implantation as a surface treatment step for preventing the out-gassing problem.

2. The present invention forms a silicon nitride layer or a silicon-oxy-nitride layer as an inner layer of the isolation layer. The ability of the invention to prevent the out-gassing problem is enhanced.

3. The isolation layer is treated by the ion implantation step to prevent the out-gassing problem. Thus, the surface area of the storage electrode is enlarged. The capacitance of the capacitor is increased, as well.

It will be apparent to those skilled in the art that various modifications and variations can be made to the structure and the method of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a storage electrode of a capacitor, comprising the steps of:

forming an isolation layer on the substrate;

performing an ion implantation step on the isolation layer to terminate broken bonds of C—H bonds and C—O bonds in the isolation layer;

forming an opening in the isolation layer, wherein the opening exposes a portion of the substrate;

forming a patterned silicon layer on the isolation layer to fill the opening; and forming a selective hemispherical grained silicon layer on the silicon layer.

2. The method of claim 1, wherein a material of the isolation layer comprises borophosphosilicate glass (BPSG).

3. The method of claim 1, wherein a material of the isolation layer comprises phosphosilicate glass (PSG).

4. The method of claim 1, wherein a material of the isolation layer comprises plasma-enhanced tetra-ethyl-ortho-silicate (PE TEOS).

5. The method of claim 1, wherein a material of the isolation layer comprises TEOS-based oxide.

6. The method of claim 1, wherein the ion implantation step is performed with a dopant of nitrogen ions.

7. The method of claim 1, wherein the isolation layer comprises a sandwich structure comprising a silicon nitride layer as an inner layer.

8. The method of claim 1, wherein the isolation layer comprises a sandwich structure comprising a silicon-oxynitride layer as an inner layer.

9. A method of fabricating a storage electrode of a capacitor, comprising the steps of:

forming an isolation layer on a substrate;

patterning the isolation layer to form an opening which exposes a portion of the substrate;

performing an ion implantation step on the isolation layer with the opening to terminate broken bonds of C—H bonds and C—O bonds in the isolation layer;

forming a patterned silicon layer on the isolation layer to fill the opening; and forming a selective hemispherical grained silicon layer on the silicon layer.

10. The method of claim 9, wherein a material of the isolation layer comprises borophosphosilicate glass (BPSG).

11. The method of claim 9, wherein a material of the isolation layer comprises phosphosilicate glass (PSG).

12. The method of claim 9, wherein a material of the isolation layer comprises plasma-enhanced tetra-ethyl-ortho-silicate (PE TEOS).

13. The method of claim 9, wherein a material of the isolation layer comprises TEOS-based oxide.

14. The method of claim 9, wherein the ion implantation step is performed with a dopant of nitrogen ions.

15. The method of claim 9, wherein the isolation layer comprises a sandwich structure comprising a silicon nitride layer as an inner layer.

16. The method of claim 9, wherein the isolation layer comprises a sandwich structure comprising a silicon-oxynitride layer as an inner layer.

* * * * *